United States Patent [19]
Dautartas et al.

[11] Patent Number: 6,124,158
[45] Date of Patent: Sep. 26, 2000

[54] METHOD OF REDUCING CARBON CONTAMINATION OF A THIN DIELECTRIC FILM BY USING GASEOUS ORGANIC PRECURSORS, INERT GAS, AND OZONE TO REACT WITH CARBON CONTAMINANTS

[75] Inventors: Mindaugas F. Dautartas, Alburtis, Pa.; Lalita Manchanda, Basking Ridge, N.J.

[73] Assignee: Lucent Technologies Inc., Murray Hill, N.J.

[21] Appl. No.: 09/327,793

[22] Filed: Jun. 8, 1999

[51] Int. Cl.$^7$ ................................................ H01L 21/8238
[52] U.S. Cl. .............................................. 438/216; 438/38
[58] Field of Search ................................................ 438/216

[56] References Cited

U.S. PATENT DOCUMENTS

| | | | |
|---|---|---|---|
| 5,661,092 | 8/1997 | Koberstein et al. | 427/515 |
| 5,851,849 | 12/1998 | Comizzoli et al. | 438/38 |
| 6,030,460 | 2/2000 | Sukharev | 118/722 |

OTHER PUBLICATIONS

Tuomo, S., "Atomic Layer Epitaxy," Thin Solid Films, vol. 216, 1992, pp. 84–89.

Tuomo, S., "Cost–effective Processing by Atomic Layer Epitaxy," Thin Solid Films, vol. 225, 1993, pp. 96–98.

Utriainen, M. et al., "Studies of NiO Thin Film Formation by Atomic Layer Epitaxy,", Materials Science and Engineering, vol. B54, 1998, pp. 98–103.

*Primary Examiner*—Wael Fahmy
*Assistant Examiner*—William M. Brewster
*Attorney, Agent, or Firm*—Gibbons, Del Deo, Dolan, Griffinger & Vecchione

[57] ABSTRACT

A process is provided for the formation of a thin film of gate dielectric or similar material on a silicon semiconductor substrate from an organic precursor by atomic layer epitaxy, wherein the organic precursor is introduced to react with the treated surface to form a bonded monolayer of reactive species. A second reactant is introduced to react with the surface to form the desired dielectric. After each step in the cycle, the reaction chamber is purged with an inert gas to prevent reactions except on the surface. The cycle is repeated tens to hundreds of times to achieve a desired final film thickness. No less frequently than every third cycle, the film undergoes a discrete treatment step wherein ozone is introduced into the chamber to oxidize carbon contaminants therein to form volatile products which are removed from the reaction chamber by purging with the inert gas. In a preferred embodiment where the substrate is silicon or polysilicon, a sub-monolayer of a protection material is formed by boding to silicon sites on the surface before the deposition of dielectric is begun. A preferred dielectric is gate aluminum oxide that is deposited using trimethyl aluminum as a precursor.

25 Claims, No Drawings

METHOD OF REDUCING CARBON CONTAMINATION OF A THIN DIELECTRIC FILM BY USING GASEOUS ORGANIC PRECURSORS, INERT GAS, AND OZONE TO REACT WITH CARBON CONTAMINANTS

This invention relates to a process for the production of ultrahigh quality gate dielectric materials for specialized semiconductor applications, for example interpoly, intermetal, interpolymetal and inter silicon-metal, intersemiconductor, intersemiconductor integrated circuits and other applications.

BACKGROUND OF THE INVENTION

A problem common to all semiconductor processing is contamination of structures formed on substrates. As those skilled in the art will appreciate, as geometries shrink and the complexity and functionality of circuitry on a given substrate increases, the problem of contamination becomes more acute. Sources of contamination for such structures include foreign materials present in the treatment chamber, foreign materials introduced via the plasma or treatment atmosphere, and contaminants introduced from the material being utilized in the treatment of the substrate, or being deposited thereon, or a precursor of such material.

Carbon is a contaminant typically encountered in semiconductor processing where an organic source, i.e. a precursor material, or treatment material is utilized. For example, where ultrathin semiconductor films are deposited by various art-recognized techniques from gaseous organic precursors, carbon is frequently present in the resultant films, regardless of the precautions taken. In such deposition techniques, the precursor(s) react, typically at an elevated temperature or in an RF plasma, to deposit the desired material. It is intended that the carbon present will form volatile by-products, e.g. carbon dioxide and carbon monoxide that can be evacuated from the reaction chamber. However, some of the precursor, and/or carbon-containing reaction products, inevitably become entrapped in the film as it is being deposited. It is essential that these contaminants be removed efficiently and without adverse effect to the film or the underlying semiconductor structure.

The problem of carbon contamination is particularly acute when the film being deposited is a dielectric material intended to function as a gate dielectric or insulator in such art-recognized applications as: alternate gate dielectric to replace the thermally grown silicon dioxide on silicon for CMOS; inter-poly dielectric for Flash memory; capacitor dielectric for DRAMS, linear capacitors for analog applications, e.g. microwave applications, and the like. Gate dielectrics in such applications, which can be as thin as 10–50 Angstroms, are especially susceptible to contamination. In such instances, the presence of carbon, including conductive carbon, will change the properties, e.g. conductivity, of the dielectric thus adversely affecting its ability to function as a gate dielectric or in memory applications. It will be appreciated that, the thinner the deposited film, the greater the sensitivity to changes in conductivity as a result of carbon contamination.

The major problem caused by the presence of carbon in thin film gate dielectrics is the formation of silicon monoxide. In applications such as discussed above, the gate dielectric, generally a metal oxide or silicon dioxide, is typically deposited directly onto silicon or polysilicon. In the vertical fabrication of semiconductor structures, because the deposited layers of material are so thin, one of the most critical requirements is that the surfaces of deposited layers be smooth. Carbon as an impurity is particularly detrimental at or near the interface of silicon and the oxide. Regardless of whether the silicon is amorphous, polycrystalline or single crystal, the carbon catalyzes the formation of silicon monoxide which is volatile due to its low vapor pressure. The volatilization of silicon monoxide from the silicon/oxide interface causes the silicon surface to become rough which can materially impact both performance and reliability of the resulting device. This can take place not only during deposition, but during subsequent annealing/densification treatments as well.

Those skilled in the art will appreciate that, although the requirements of smoothness and uniformity for any material deposited onto the surface of a semiconductor substrate in the construction of VLSI circuitry are stringent, those for gate dielectric material are particularly so since the integrity of gate dielectric materials is essential to the performance and reliability of the device. Therefore, surface roughness of the substrate, particularly where an overlying dielectric may not have optimum covering capacity, can significantly degrade both performance and reliability of devices formed therefrom.

There are several art-recognized techniques for preventing or minimizing carbon contamination in semiconductor dielectric films. Perhaps the most common is simply to raise the temperature in the reaction chamber, thus enhancing the formation of volatile carbon compounds, primarily carbon monoxide and carbon dioxide, which can be evacuated from the chamber. This solution, however, cannot be utilized when it is desired to deposit a dielectric film from an organic precursor at low temperatures. Another significant limitation to this solution is that the temperature cannot be raised above the pyrolysis temperature of the organic precursor since that would significantly raise the amount of carbon contamination in the film. Another common technique is to remove the carbon contaminant post-deposition of the dielectric film by high-energy processes, such as the generation of in-situ plasmas and in-situ ion bombardment of the film. These processes, which typically also cause the formation of carbon monoxide and carbon dioxide, are not suitable for all situations where it is desired to remove carbon contamination, particularly where the substrate contains structures that are not sufficiently robust to withstand such high energy treatment. Again, as the size and thickness of films deposited on a semiconductor substrate shrink, so do the possible applications of such high-energy treatments to remove carbon contamination.

Hence, it will be appreciated that there is a need for an efficient process for the deposition of gate dielectric or other similar materials from an organic precursor at low temperatures wherein the deposited film can be rendered substantially free of carbon contamination without resorting to conventional procedures that could have a negative effect on the performance or reliability of devices formed therefrom. The exponential growth of the semiconductor industry can only be sustained if high dielectric constant(K) materials can be developed for applications such as those discussed above. Such materials are provided in accordance with the present invention.

SUMMARY OF THE INVENTION

There is disclosed a process for forming gate dielectric and other similar semiconductor thin film structures by atomic layer epitaxy from an organic precursor wherein the deposited film is substantially free of carbon contamination, thereby assuring that the substrate/dielectric interface will be smooth. The subject process consists of the discrete treatment step of oxidizing carbon contaminants periodically during the repetitious build-up of a dielectric layer of desired thickness by introducing ozone into the reaction chamber to form gaseous products therewith and purging the chamber with an inert gas to remove such products. The subject process is particularly advantageous for the low temperature deposition of aluminum oxide gate dielectric from an organic precursor, such as trimethyl-aluminum. However, the invention is not limited to aluminum oxide, but is generally applicable to other dielectrics deposited from carbon-containing precursors, e.g. tantalum oxide from tantalum alcoholate (pentaethoxytantalum). In a preferred embodiment where the substrate is silicon or polysilicon, a submonolayer of a barrier material, such as silicon dioxide or silicon oxynitride, is formed on the substrate prior to the deposition of the dielectric.

DETAILED DESCRIPTION OF THE INVENTION

Atomic layer epitaxy, or atomic layer deposition, is a digital heterogeneous deposition process known to those skilled in the art. In essence, it involves the build-up of a thin film of desired thickness by repeatedly depositing saturated monoatomic layers. Films produced by atomic layer epitaxy are characterized by exceptional uniformity of substrate coverage over a large substrate area as well as excellent step coverage. The technique involves individually depositing precursors, or reactants, that will react in situ to form the desired film material utilizing techniques that prevent contact between them except on the surface of the substrate.

Preventing the reaction from taking place except on the surface of the substrate is accomplished in atomic layer epitaxy by treating the surface of the substrate with a first reactive material to deposit it thereon, purging the chamber with an inert gas to remove residual reactive material, and then treating the surface with the second reactive material that will react with the first to form the desired film. Because of the technique of purging the chamber between steps, the two reactants react only on the surface to form a monolayer of the desired thin film material with excellent surface saturation density and step coverage. These two discrete depositions of the reactants are commonly referred to as a cycle. The reaction chamber is again purged with the inert gas before the cycle is repeated. As a cycle forms only a monoatomic layer, it is necessary that the cycle be repeated tens, or even hundreds, of times in order to form a gate dielectric film of the desired thickness.

Since atomic layer epitaxy is carried out at constant temperature and the deposition steps are separated by purging with inert gas, the cycle described above can be repeated as many times as are necessary to achieve a desired thickness of the final film. It is also recognized that the cycles can be repeated in rapid sequence and that each of the steps comprising them has a very short duration. Hence, those skilled in the art commonly refer to the brief exposure of the surface to a particular reactant as a pulse. This terminology will be utilized hereinafter.

Atomic layer epitaxy is advantageous in that very reactive materials can be utilized, since they will contact with and react with each other only on the surface of the substrate. Using such highly reactive precursors makes possible the deposition of useful, dense, dielectric films at lower temperatures. Furthermore, this technique eliminates gas phase reactions and gas phase powder formation, both of which detract from the quality and saturation density of the film. Thin films deposited by atomic layer deposition, primarily due to their saturation density, possess excellent uniformity and surface conformity. This latter property makes them exceptionally useful as dielectric gate materials in the fabrication of hybrid complex circuits in three dimensional design structures and superlattices. In such structures, it is a requirement of a dielectric gate that it be deposited over substrate topography, e.g. steps and vias, with uniformity and virtually perfect pinhole density. It is a further requirement of the deposition process that the dielectric layer be deposited with an absolute minimum of contamination.

Atomic layer epitaxy is typically carried out in a hot wall reactor. By this is meant that the entire reactor is heated to a uniform temperature. The deposition reactor can be any art-recognized chamber that can be heated by any conventional means so that the temperature is uniform throughout. It is important that the temperature in the deposition chamber be uniform because "cold spots" in the chamber can cause desorption of portions of the film. In general, conventional low temperature chemical vapor deposition chambers are suitable for deposition by atomic layer epitaxy. The source of gaseous reactants and sequencing of the gas flows can be controlled by conventional processor-controlled apparatus utilizing art-recognized hardware, such as pulsed valves, flow controllers and the like.

In view of the fact that atomic layer epitaxy can readily be adapted to deposition at low temperatures, it is ideally suited to the deposition of dielectric materials on substrates that already contain structures sensitive to higher temperatures. It is especially suited for the deposition of dielectric materials, such as aluminum oxide, $Al_2O_3$, from organic precursors, particularly trimethyl aluminum, $Al(CH_3)_3$. It may be utilized for the deposition of other similar materials such as tantalum oxide and silicon dioxide. A useful gate dielectric layer of aluminum oxide can be deposited from trimethyl aluminum by atomic layer epitaxy at temperatures as low as 190° C. In general, films deposited below 190° C. are not dense and reproducible. A deposition temperature range between 190° C. and 300° C. may be used for the applications discussed herein. Although trimethyl aluminum can be deposited at higher temperatures, i.e. up to 330° C., it is preferred for the considerations discussed above to deposit it at temperatures as low as possible.

In accordance with the present invention, carbon contamination is effectively removed from gate dielectric layers and similar materials deposited by atomic layer epitaxy from organic precursors by periodically introducing ozone as a discrete treatment or step in the process. The ozone enhances the atomic layer deposition process by oxidizing carbon to form gaseous products, particularly carbon dioxide and/or carbon monoxide, which can be removed by inert gas purging. The effective removal of carbon is particularly significant in a process where the desired dielectric layer has been deposited from an organic precursor at low temperature since lowering the deposition temperature typically increases the level of carbon contamination.

The substrate to receive the dielectric layer in accordance with the present invention can be any conventional type, such as silicon wafers, dielectric materials, Group III–V elements, compounds thereof and the like. It is necessary that the substrate be susceptible of being hydroxylated to some degree. By this is meant that the substrate will either have free hydroxyl groups on the surface or chemical moieties on the surface that can be treated to form free hydroxyl groups. For example, silicon can be treated with hydrogen peroxide as a pre-deposition treatment before being admitted to the reaction chamber. The surface to receive a gate dielectric layer in accordance with the present process typically will have patterned layers of semiconductor material on its surface as would be expected in the fabrication of semiconductor devices.

The substrate is initially heated to the deposition temperature, e.g. 190° C., for the deposition of aluminum oxide from trimethyl aluminum. Since the subject process is carried out in a hot wall reactor as discussed above, the reactor is heated to the deposition temperature. The substrate would be placed into the reactor, which would then be flushed with inert gas prior to heating to deposition temperature. Once the substrate has reached deposition temperature, it is treated, e.g. with a water vapor pulse, to cause the formation of reactive hydroxyl groups on the surface thereof as discussed above. In a preferred embodiment of the present invention, the substrate is initially pretreated with an ozone pulse to cleanse it of any organic matter or other oxidizable impurities that may be on the surface.

Following the pretreatment step or steps discussed above, the surface is purged with inert gas and the cycle initiated by treating the surface with the first reactant of the reactant pair and the reaction chamber again purged with inert gas. In the case of depositing a gate dielectric layer of aluminum oxide, the reactant is preferably trimethyl aluminum, $Al(CH3)3$. The trimethyl aluminum will react with the hydroxyl groups on the surface at the reactor temperature to form a bonded submonolayer of reactive aluminum oxide species having the general formula $AlOxHy$ wherein x is an integer from 1 to 3 and y is an integer from 0 to 2. It is important that there be an excess of the aluminum species at the surface so that there is complete reaction with the hydroxyl groups formed thereon. Unreacted aluminum oxide species will be removed from the reaction chamber in the purge so that none will remain to react in the gas phase during the following water vapor pulse.

Following the purge step, the surface is treated with the second reactant, a water vapor pulse. The water vapor reacts with the aluminum oxide species on the surface to complete the transformation to aluminum oxide gate dielectric and also hydroxylates the surface for the following cycle. The water vapor pulse is followed by a purge with inert gas to remove any residual water vapor so that it does not react with the trimethyl aluminum precursor in the gas phase during the subsequent cycle.

A pulse as the term is utilized herein refers to the duration of treatment of the substrate with a reactant in atomic layer epitaxy. It is not necessary that it be the same for both reactants. For illustration, in the deposition of aluminum oxide gate dielectric as described herein, the trimethyl aluminum pulse is from about 0.5 to 1.5 seconds and the water vapor pulse is preferably from about 1 to 3 seconds.

In accordance with the present invention, the carbon contaminants in the growing film of dielectric material are periodically removed by carrying out an ozone pulse as a discrete treatment step between cycles. In order for the process of the invention to be effective under the conditions of atomic layer epitaxy, it is preferred to carry out an ozone treatment step no less frequently than every third cycle. It will be appreciated that, unless the treatment is carried out at reasonably frequent intervals, the thickness of the film itself may detract from the efficiency of the treatment. The ozone treatment is preferably carried out every 1 to 3 cycles, most preferably every cycle. The repetition range given is optimum for deposited films of aluminum oxide dielectric as described above. It will be appreciated by those skilled in the art that the number of deposition cycles may vary depending of the material being deposited, the thickness of the film deposited per cycle and other factors such as the temperature in the reactor, and possibly the configuration of the reactor.

The ozone pulse in accordance with the present process will be from about 1 to 10 seconds, preferably from about 3 to 10 seconds. The ozone utilized in accordance with the present process can be obtained by any conventional technique, preferably by treating purified oxygen ambient with high-intensity UV light or intense cold plasma. It is recognized that such treatments convert only up to about 10% by volume of the oxygen flow to ozone and that it is generally not possible to effective stabilize the ozone from deteriorating. Therefore, it is preferred to generate the ozone in-situ as it is being used in order to have a maximum concentration available for reaction. By "in situ" is meant that the ozone generator would be part of the vacuum train as opposed to being inside the hot wall reactor. The ozone reacts with, i.e. oxidizes, carbon contaminants in the film to form volatile species, primarily carbon monoxide and carbon dioxide, which can be purged from the reaction chamber. The ozone pulse is followed by a purge pulse, then a water vapor pulse to rehydroxylate the surface, a purge pulse, and the cycle is repeated.

It is known to utilize ozone gas in atomic layer epitaxy. Utriainen et al. Elsevier Materials Science and Engineering B54 (1998) pp 98–103, describe the use of ozone as a source of oxygen in the deposition of a thin-layer of NiO from an organic precursor such as $Ni(acac)_2$. It is stated that ozone was utilized as a reactant due to poor gas phase stability problems with the organic precursors tested since it is very reactive at the low deposition temperatures required for the precursor. A slight increase in growth rate was noted when the ozone was combined with water vapor. In the described process, ozone is a reactant in every cycle. It is stated that ozone was selected over other known sources of oxygen solely on the basis of its comparatively higher reactivity in the formation of the NiO films at low deposition temperatures.

The inert gas utilized to purge the reactor between the various treatment pulses as described above can be any gas that does not react with or, perhaps more important, contaminate the substrate or the layer of material being deposited. Such gases include, for example, nitrogen, argon, xenon and the like. For reasons of economy and availability, nitrogen is the preferred inert gas for the subject process. However, the heavier gases may prove advantageous in densification of the deposited film and purging of the reactor. The process of the present invention is advantageous in that it may be carried out in a single deposition reactor, even given the number of repetitions that may be required to achieve a given thickness of dielectric film. Further, since it is carried out at a constant temperature, repetitions may be carried out virtually continuously since there is no need to interrupt the sequence for temperature change, a significant advantage.

In a preferred embodiment of the present invention, the process of reducing carbon contamination in a layer of gate dielectric deposited by atomic layer epitaxy onto a silicon or polysilicon substrate from an organic precursor is enhanced by the formation on the substrate of a sub-monolayer of protective material. The protective material is preferably selected from the group consisting of silicon dioxide, silicon oxynitride or silicon nitride. This layer forms an additional barrier to the formation of silicon monoxide thereby providing additional protection for the smoothness and integrity of the interface between and silicon substrate and the layer of gate dielectric deposited thereover. This sub-monolayer of protection material is an adjunct to and an extension of the process of the invention.

The term "sub-monolayer" as utilized in the context of the layer of protection material means that the layer does not completely cover the surface of the silicon substrate upon which the gate dielectric will be deposited. Rather the protection material binds to at least the reactive silicon sites on the surface in contrast to a monolayer that would saturate all available sites on the surface. Thus, the sub-monolayer is a barrier to the formation of silicon monoxide yet does not prevent treatment of the surface to form hydroxyl groups thereon as discussed above.

The sub-monolayer of protection material, preferably silicon dioxide, silicon oxynitride or silicon nitride, may be formed by a number of art-recognized techniques. Silicon dioxide may be formed by thermo-oxidation or atomic layer epitaxy, chemical vapor deposition or a low temperature plasma. Silicon oxynitride may be formed by the foregoing methods by the addition of ultrapure nitrogen to the reaction plasma or environment. Silicon nitride may be formed by chemical vapor deposition, a plasma or atomic layer epitaxy.

Atomic layer epitaxy utilizing inorganic silane compounds is advantageous for the deposition of the layer in that, although generally regarded as slower than processes utilizing organic precursors, it is carbon-free and affords the precise control necessary for the deposition of the sub-monolayer. The sub-monolayer may be deposited as an initial step in the process of forming a layer of dielectric as described herein, or suitable silicon substrates may have the layer deposited thereon prior to being admitted to the reaction chamber. The use of the sub-monolayer of protection material in conjunction with the process of forming the gate dielectric as described herein represents a significant advance in the technology of forming such structures on a silicon substrate.

Although the present invention has been described in terms of particular embodiments, numerous changes can be made thereto as will be known to those skilled in the art. The invention is only meant to be limited in accordance with the limitations of the appended claims.

What is claimed is:

1. A process for forming a thin film of dielectric on a semiconductor substrate, said film having reduced carbon contamination, comprising heating the substrate under an inert atmosphere in a suitable reaction chamber to a temperature such that a selected gaseous organic precursor for said dielectric will react to form a bonded reactant on the surface, and carrying out multiple deposition cycles at said temperature to form said thin dielectric film, each deposition cycle comprising:
   a) introducing the gaseous organic precursor into the reaction chamber so that it reacts to form said bonded reactant on the surface;
   b) purging the reaction chamber with an inert gas;
   c) introducing a second gaseous reactant into the chamber which reacts with said bonded reactant to form said dielectric film; and
   d) purging the reaction chamber with the inert gas,
wherein no less frequently than every third cycle, introducing ozone into the reaction chamber following step d) to react with carbon contaminants in the film thereby forming gaseous products and purging the reaction chamber with said inert gas to remove such products prior to initiating the next cycle.

2. A process in accordance with claim 1, wherein the substrate is silicon and the film is a gate dielectric of aluminum oxide.

3. A process in accordance with claim 2, wherein the gaseous organic precursor is trimethyl aluminum and the second gaseous reactant is water vapor.

4. A process in accordance with claim 3, wherein the substrate is initially heated to a temperature from about 190° to 300° C.

5. A process in accordance with claim 4, wherein the substrate is initially heated to a temperature of about 190° C.

6. A process in accordance with claim 1, wherein ozone is introduced into the reaction chamber after every one to three cycles.

7. A process in accordance with claim 6, wherein ozone is introduced into the reaction chamber after every cycle.

8. A process in accordance with claim 1, wherein the inert gas is nitrogen.

9. A process in accordance with claim 1, wherein prior to step a) of said first cycle, the surface of the substrate is pretreated by introducing ozone into the reaction chamber to form gaseous products from contaminants on the substrate surface and the chamber is purged with said inert gas.

10. A process in accordance with claim 1, wherein the substrate surface does not contain hydroxyl groups and, prior to step a) of said first cycle, the surface is treated to form hydroxyl groups thereon.

11. A process in accordance with claim 10, wherein the surface is treated with water vapor at the reaction temperature.

12. A process in accordance with claim 10, wherein the surface of the substrate is treated prior to being admitted to the reaction chamber.

13. A process in accordance with claim 12, wherein the substrate is silicon and the surface is treated with hydrogen peroxide to form hydroxyl groups thereon.

14. A process in accordance with claim 1, wherein after each of said ozone treatment and purge with inert gas, the surface of the substrate is treated with water vapor at the reaction temperature to form hydroxyl groups thereon and the reaction chamber thereafter purged with said inert gas prior to initiating the next cycle.

15. A process in accordance with claim 1, wherein the substrate is silicon or polysilicon and, prior to step a), the reactive silicon sites on the surface are bonded to a protection material such that a sub-monolayer of protective material is formed thereon.

16. A process in accordance with claim 15 where said protection material is selected from the group consisting of silicon dioxide, silicon oxynitride and silicon nitride.

17. A process in accordance with claim 15, wherein said sub-monolayer is formed by atomic layer epitaxy from an inorganic precursor.

18. A process in accordance with claim 15, said protection material is silicon dioxide and said sub-monolayer is formed by thermo-oxidation of the substrate.

19. A process for forming a thin film of aluminum oxide gate dielectric on a semiconductor substrate, said film having reduced carbon contamination, comprising heating the substrate under an inert atmosphere in a suitable reaction chamber to a temperature such that a trimethyl aluminum will react to form a bonded reactant on the surface thereof, treating the surface of the substrate with water vapor to form hydroxyl groups thereon and carrying out multiple deposition cycles at said temperature to form said thin gate dielectric film, each deposition cycle comprising:
   a) introducing trimethyl aluminum into the reaction chamber so that it reacts to form said bonded reactant on the surface;

b) purging the reaction chamber with an inert gas;

c) introducing water vapor into the chamber which reacts with said bonded reactant to form said aluminum oxide gate dielectric film; and d) purging the reaction chamber with the inert gas, wherein no less frequently than every third cycle, introducing ozone into the reaction chamber following step d) to react with carbon contaminants in the film thereby forming gaseous products and purging the reaction chamber with said inert gas to remove such products prior to initiating the next cycle.

20. A process in accordance with claim 19 further wherein, prior treating the surface of the substrate to form hydroxyl groups thereon, the surface is pretreated by introducing ozone into the reaction chamber to form gaseous products from contaminants on the substrate surface and the chamber is purged with said inert gas.

21. A process in accordance with claim 20, wherein the substrate is silicon or polysilicon and, prior to treating the surface to form hydroxyl groups thereon, the reactive silicon sites on the surface are bonded to a protection material such that a sub-monolayer of protective material is formed thereon.

22. A process in accordance with claim 19, wherein after each of said ozone treatment and purge with inert gas, the surface of the substrate is treated with water vapor at the reaction temperature to form hydroxyl groups thereon and the reaction chamber thereafter purged with said inert gas prior to initiating the next cycle.

23. A semiconductor substrate having formed thereon a film of dielectric by the process of claim 1.

24. A silicon semiconductor substrate having formed thereon a film of aluminum oxide gate dielectric by the process of claim 19.

25. A silicon semiconductor substrate having formed thereon a film of aluminum oxide gate dielectric by the process of claim 21.

* * * * *